United States Patent
Tompkins et al.

(10) Patent No.: US 6,561,498 B2
(45) Date of Patent: May 13, 2003

(54) BUBBLER FOR USE IN VAPOR GENERATION SYSTEMS

(75) Inventors: Gregory Edward Tompkins, Salt Point, NY (US); Don Nus Sirota, Poughkeepsie, NY (US); Raymond Carl Logue, Somers, NY (US)

(73) Assignee: Lorex Industries, Inc., Poughkeepsie, NY (US)

( * ) Notice: Subject to any disclaimer, the term of this patent is extended or adjusted under 35 U.S.C. 154(b) by 0 days.

(21) Appl. No.: 09/829,348

(22) Filed: Apr. 9, 2001

(65) Prior Publication Data

US 2002/0145210 A1 Oct. 10, 2002

(51) Int. Cl.[7] .................................................. B01F 3/04
(52) U.S. Cl. ................... 261/77; 261/124; 261/DIG. 65
(58) Field of Search ........................ 261/66, 77, 121.1, 261/123, 124, DIG. 65

(56) References Cited

U.S. PATENT DOCUMENTS

| | | | | |
|---|---|---|---|---|
| 2,719,032 A | * | 9/1955 | Schnur ........................ 261/123 |
| 3,216,181 A | * | 11/1965 | Carpenter et al. .......... 261/123 |
| 3,305,340 A | * | 2/1967 | Atkeson ...................... 261/124 |
| 4,215,082 A | * | 7/1980 | Danel ............................ 261/77 |
| 4,273,731 A | * | 6/1981 | Laurie et al. .................. 261/77 |
| 4,329,234 A | * | 5/1982 | Cikut et al. ................. 261/124 |
| 5,078,922 A | * | 1/1992 | Collins et al. .............. 261/124 |
| 5,476,547 A | * | 12/1995 | Mikoshiba et al. ......... 261/124 |
| 5,921,428 A | * | 7/1999 | Rodgers ...................... 220/506 |
| 6,161,398 A | | 12/2000 | Partis .......................... 65/379 |
| 6,180,190 B1 | | 1/2001 | Gordon ....................... 427/565 |

FOREIGN PATENT DOCUMENTS

| | | | | |
|---|---|---|---|---|
| DE | 3447060 A1 | * | 7/1986 | .................. 261/124 |
| FR | 1315714 | * | 12/1962 | .................. 261/124 |
| GB | 1444476 | * | 7/1976 | .................. 261/124 |
| JP | 54-131171 | * | 10/1979 | .................. 261/124 |
| JP | 56-3094 | * | 1/1981 | .................. 261/124 |

* cited by examiner

*Primary Examiner*—C. Scott Bushey
(74) *Attorney, Agent, or Firm*—Graham S. Jones, II

(57) ABSTRACT

A bubbler for use in vapor generation systems that minimizes splashing and the formation of aerosol droplets of liquid, which are carried out of the bubbler in the vapor stream and result in erratic mass transfer of the process chemical liquid. A closed stainless steel vessel contains a carrier gas distribution plenum that distributes the carrier gas to a plurality of small diameter generator tubes, which are submerged into the process chemical liquid. The length, inside diameter and number of the generator tubes are designed to inject a high velocity, small diameter stream of carrier gas into the liquid such that a long small diameter cylinder of carrier gas is created in the process chemical liquid. The surface tension of the liquid-gas interface causes the cylinder of gas to be pinched off at intervals along the length of the cylinder to produce a plurality of small bubbles the diameter of which is largely independent of the carrier gas flow rate. By preventing the formation of large diameter bubbles at high carrier gas flow rates splashing and the formation of aerosol droplets of liquid are effectively eliminated.

20 Claims, 5 Drawing Sheets

BUBBLER FOR USE IN VAPOR GENERATION SYSTEMS

BACKGROUND OF THE INVENTION

1. Field of the Invention

This invention relates to bubblers for supplying a vapor to a chemical process by introducing a carrier gas into a process chemical liquid to form a mixture of the vapor of the process chemical with the carrier gas.

2. Description of Related Art

U.S. Pat. No. 5,078,922 of Collins et al. shows a "Liquid Source Bubbler."

U.S. Pat. No. 5,921,428 of Rodgers shows a "Self-Metering Reservoir".

SUMMARY OF THE INVENTION

An object of the invention is to provide a bubbler that suppresses splashing and the generation of aerosol droplets at high carrier gas flow rates, which exit the bubbler in the outlet flow mixture of the carrier gas and a chemical vapor, thus creating erratic variations in chemical mass transfer.

Another object of the invention is to provide the high flow rate of the carrier gas and the chemical vapor with anti-aerosol properties with a bubbler having a small internal volume.

A further object of the invention is to provide a high flow rate small volume bubbler, whose outlet concentration of chemical vapor to carrier gas is independent of the carrier gas flow rate.

Another object of the invention is to provide a high flow rate small volume bubbler, whose outlet concentration of chemical vapor to carrier gas is largely independent of the liquid level in the bubbler.

In accordance with the above objects, the invention provides an apparatus and method for generating a saturated mixture of a carrier gas and a chemical vapor devoid of chemical liquid droplets. The bubbler consists of a closed stainless steel bubbler container having a carrier gas inlet tube, a carrier gas/vapor outlet, a process chemical liquid fill inlet and a process chemical liquid drain outlet. The carrier gas inlet tube passes through the top of the bubbler container and into an enclosed plenum that distributes the carrier gas to a plurality of small generator tubes. The generator tubes extend from the bottom of the plenum down into the process chemical liquid in the bubbler container. The dimensions of the generator tubes are chosen such that at the maximum carrier gas flow rate the carrier gas stream exiting the generator tube into the liquid is a high velocity fully developed laminar flow comprising a cylindrical stream. Under these conditions the exiting cylindrical stream of carrier gas maintains a small diameter cylindrical shape in the process chemical liquid for a substantial distance from the outlet end of the generator tube. As the stream stretches farther away from the outlet end of the generator tube, the surface tension at the carrier gas/process chemical liquid interface acts to pinch off the cylindrical stream of carrier gas into a series of small bubbles whose diameter is primarily a function of the diameter of the cylindrical stream of carrier gas and the surface tension. The bubble diameter is almost independent of flow rate. The series of small bubbles rises up through the process chemical liquid and quickly becomes fully saturated with chemical vapor due to their large surface-area-to-volume ratio. A further benefit of maintaining small bubble size is that the rate of bubble ascent is limited, thus increasing contact time with the process chemical liquid while minimizing splashing and the formation of aerosol droplets of liquid when the bubble breaks the surface of the process chemical liquid. The carrier gas vapor outlet port extends through the top of the bubbler container and is located behind the plenum such that the plenum acts as a baffle to shield the carrier gas vapor outlet port from the surface of the process chemical liquid as a further means of preventing any liquid from entering the outlet stream.

Chemical liquid level measurement means measure the chemical liquid level inside the bubbler container to provide for chemical liquid level alarm conditions and for automatic filling. A piezo-ceramic transducer is bonded to the outside surface of the bottom of the bubbler container in an area aside from the location of the generator tubes. An electrical signal is applied to the piezo-ceramic transducer that generates an elastic wave that propagates through the bottom of the stainless steel bubbler container and into the process chemical liquid. The acoustical wave propagates through the process chemical liquid and is almost totally reflected at the surface of the process chemical liquid due to the mismatch in acoustical impedance between a liquid and a gas. The reflected acoustical wave propagates back through the liquid and the bottom of the bubbler container and is received by the piezo-ceramic transducer, thereby producing an electrical signal, which is detected and processed to determine the time delay between the transmitted and received signals. The height of the liquid above the piezo-ceramic transducer is calculated as a function of the measured time delay and the known speed of sound in the liquid. Because the speed of sound in a liquid is almost independent of the chemical composition of the liquid, a generic speed of sound of 1,300 meters per second can be used and still maintain a liquid level measurement accuracy of ±10%.

The column of process chemical liquid above the piezo-ceramic transducer is partially isolated from the bulk of the process chemical liquid volume by a stainless steel baffle attached to the inside wall of the bubbler container. The baffle keeps the process chemical liquid surface above the piezo-ceramic transducer relatively smooth, further enhancing the accuracy of the time delay measurement. Small gaps at the top and bottom of the baffle connect the volume enclosed by the baffle with the rest of the volume of the bubbler container, thus allowing the height H' of the process chemical liquid level in the volume enclosed by the baffle to remain in equilibrium with the height H of the process chemical liquid level in the main volume of the bubbler container.

Temperature control means allow bubbler operation above ambient temperature to increase the outlet concentration of chemical vapor in the carrier gas. These include a molded silicon-rubber insulating jacket that encapsulates the bubbler container and inlet and outlet fittings, heating elements bonded to the exterior surfaces of the bubbler container, a temperature measurement means and a temperature feedback control means.

DETAILED DESCRIPTION OF THE INVENTION AND ITS PREFERRED EMBODIMENTS

For ease of discussion, the following description of the invention and its preferred embodiments of the invention will reference the accompanying drawings, it being understood that the described preferred embodiments are not intended to limit the scope of the invention as defined by the appended claims.

Figure 1:
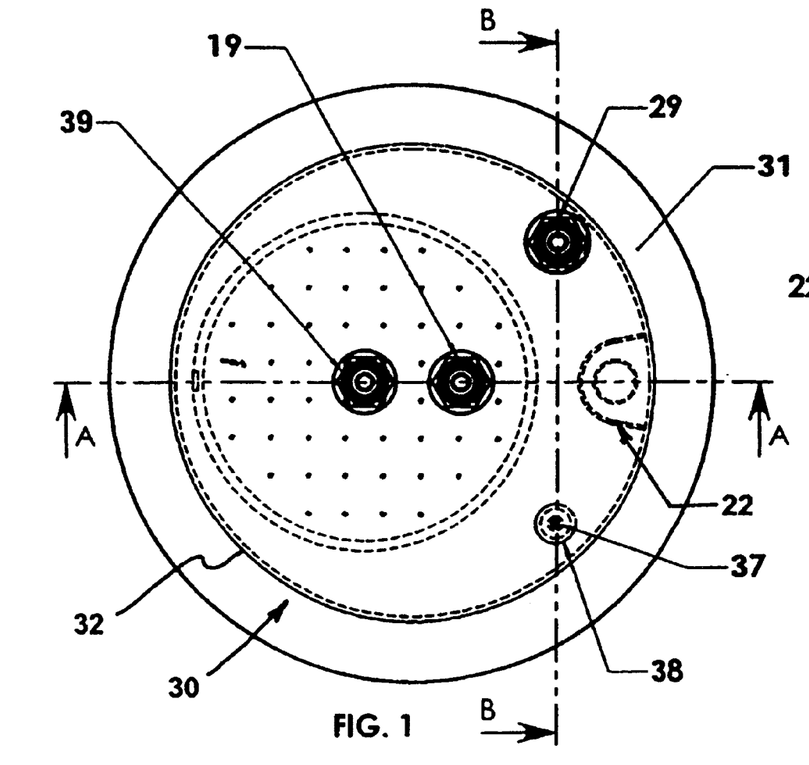
FIG. 1 is a top view of a bubbler in accordance with the present invention.
Figure 2:
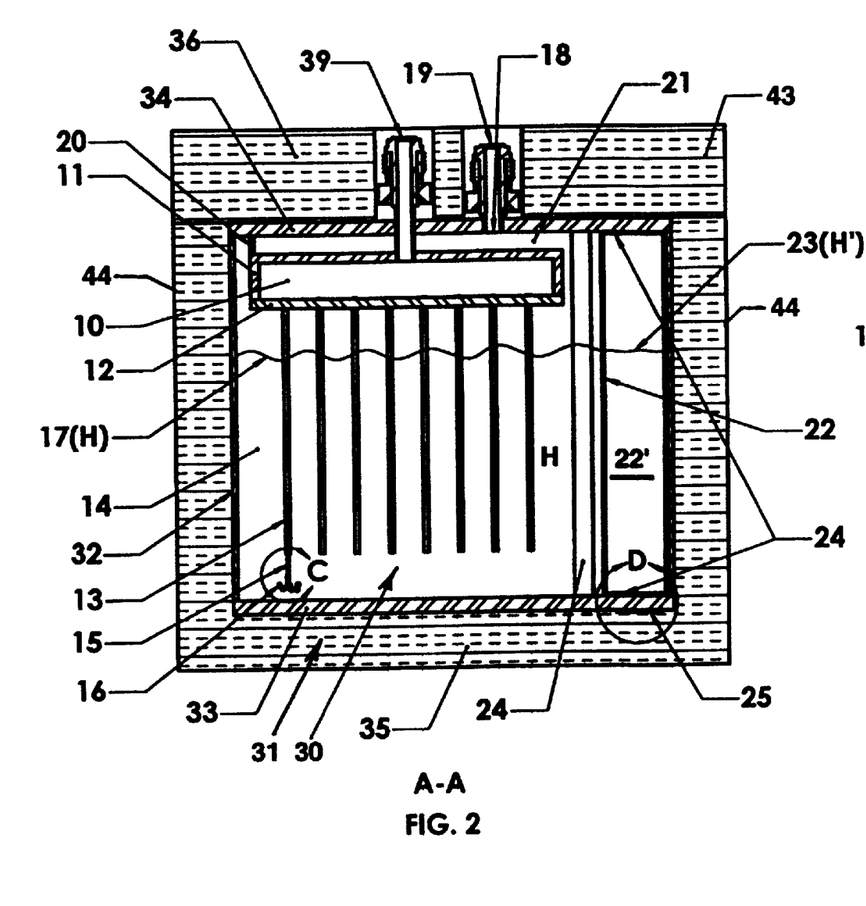
FIG. 2 is a sectional view taken along the section line A—A in FIG. 1.
Figure 5:
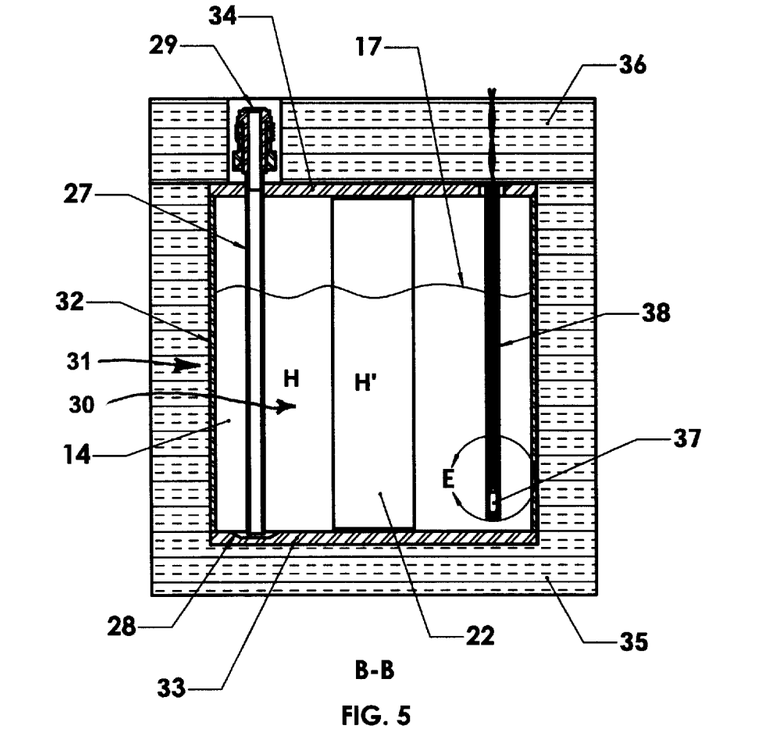
FIG. 5 is a sectional view taken along the section line B—B in FIG. 1.
Figure 6:
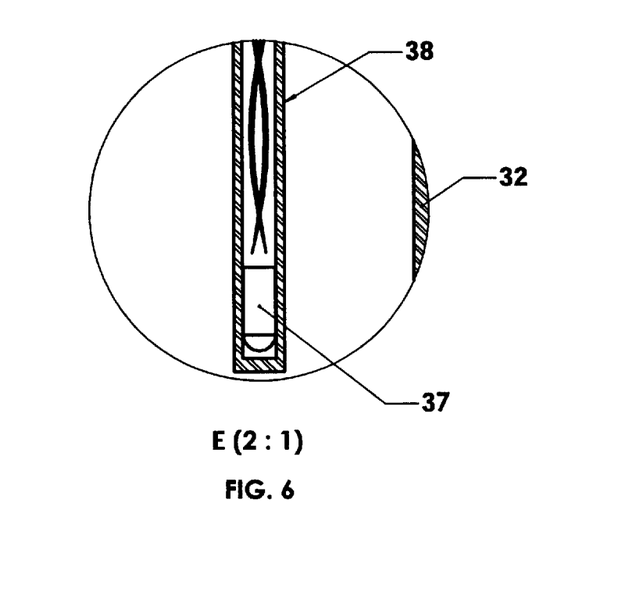
FIG. 6 is a detail view E in FIG. 5 illustrating the temperature sensor inside a temperature sensor well.

FIG. 1, shows a top view of the entire bubbler 31. FIG. 2 is a sectional view taken along line A—A of FIG. 1 which illustrates the basic elements of the invention. The bubbler 31 includes a bubbler container 30 consisting of a side wall 32, a bottom 33 and a top 34. The bubbler container 30 is enclosed in an insulated heating jacket 43, (surrounding the side wall 32, bottom 33 and top 34) such as the type made by Watlow comprised of sidewalls 44, base 35 and top 36. A temperature sensor 37 inside a temperature sensor well 38 senses the temperature of the process chemical liquid 14 as shown in FIG. 5 and FIG. 6. The temperature sensor 37 can, for example, be a thermistor, such as a TO501/B2-P60BB103M-CQOGA manufactured by Thermometrics, Edison N.J.

Figure 7:
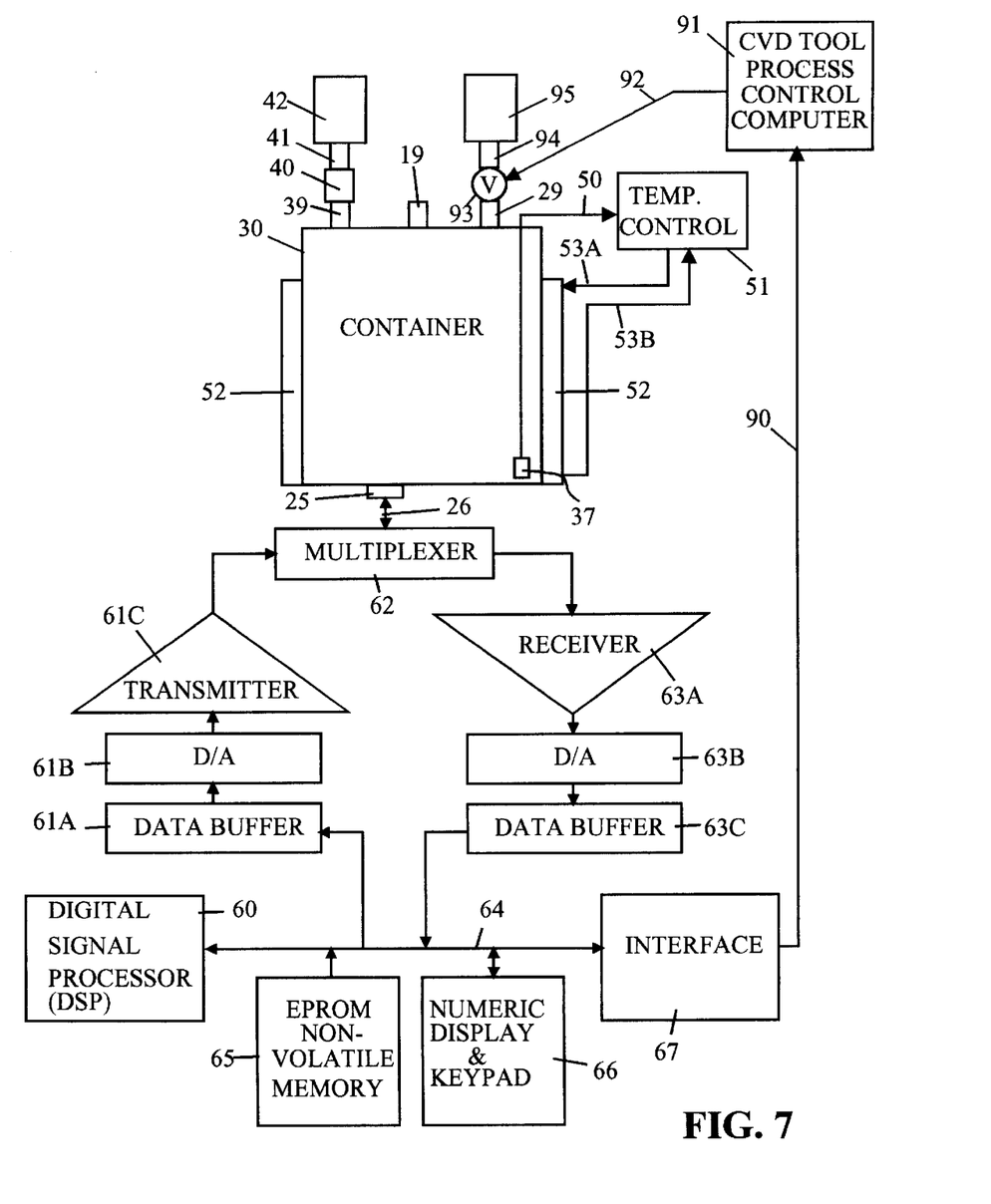
FIG. 7 is a schematic diagram showing the control systems and fluid flow systems of the present invention.

Referring to FIG. 7, the bubbler container 30 is shown with a gas source 42 connected by fitting 41 through line 40 to the gas inlet fitting 39. The bubbler container 30 has a gas outlet port 18 and gas outlet fitting 19 for the gas provided by the bubbler 31. A reservoir 95 for the process chemical liquid 14 is shown connected by fitting 94, valve 93 and fluid inlet fitting 29 to the bubbler container 30. A heating jacket 52 surrounds the bubbler container 30. A temperature sensor 37 is connected by a cable 50 to a temperature controller 51 which is connected to provide power to the heating jacket 52 by cables 53A/53B. The temperature controller 51 controls provision of power to the jacket 52 to maintain the temperature of the process chemical liquid 14 at or near a preset temperature value. An example of such a temperature control unit is the model 96A temperature controller manufactured by Watlow. The temperature controller 51 is connected by lines 53A and 53B to the heating jacket 52 which surrounds the bubbler container 30.

The bubbler container 30 including the side wall 32, bottom 33 and top 34, the inlet fittings 39 and the interior components of the bubbler 31 are composed of a high purity, corrosion resistive material(s), such as stainless steel, quartz, a fluoropolymer, or the like. Welded stainless steel, e.g., 316L stainless steel, is a particularly preferred material for the bubbler 31. A carrier gas enters the bubbler 31 at a controlled mass flow rate through a gas inlet fitting 39, and flows directly into an enclosed distribution plenum 10 comprised of a plenum cap 11 and plenum base 12 which defines a plenum volume.

The distribution plenum 10 supplies the carrier gas to a parallel array of a plurality of small diameter, laminar flow generator tubes 13 that extend from the plenum base 12 down into the volume of the process chemical liquid 14. The bubbler container 30 is filled to a depth or level 17 (H) well above the outlet ends at the bottoms of the laminar flow generator tubes 13. The design of the parallel array of laminar flow generator tubes 13 simultaneously satisfies the requirements that the length of a laminar flow generator tube 13 is approximately greater than one hundred times the internal diameter of the generator tube 13, i.e. the length of the laminar flow generator tube 13 is on the order of two orders of magnitude greater than the internal diameter thereof, and at the maximum rated carrier gas flow rate of the bubbler the Reynolds number of the flow inside a laminar flow generator tube 13 is typically less than 1000.

EXAMPLE

We have found that for a maximum carrier gas flow rate of 20 standard liters per minute of nitrogen gas and a bubbler operating temperature and pressure of 60° C. and 760 torr, with a parallel array of 52 laminar flow generator tubes 13 having an ID of 0.07874 cm (0.031 in.) and a length of 8.890 cm (3.5 in.) results in a Reynolds number of nominally 700.

The carrier gas flow exits as a laminar flow of small bubbles from each of the parallel array of long, laminar flow generator tubes 13 with a fully developed pattern of laminar flow and a corresponding parallel array of cylindrical streams 15 of gas bubbles extending from the end of the generator tubes 13 down into the process chemical liquid 14. As each of the cylindrical streams 15 stretches farther away from the outlet end of the laminar flow generator tube 13 associated therewith, the surface tension at the liquid gas interface causes the cylindrical stream 15 of carrier gas to be pinched off at consistent intervals to form a stream of consistently sized small bubbles 16 having diameters on the order of 1.6 times that of the ID of the laminar flow generator tube 13, i.e. forming a stream of substantially equally sized liquid 14 bubbles. Each of the exiting cylindrical streams 15 of gas maintains a small diameter cylindrical shape in the process chemical for a substantial distance from the outlet end of the small inner diameter generator tube 13. As each stream 15 stretches farther away from the outlet end of the small inner diameter generator tube 13, the surface tension at the carrier gas/process chemical liquid interface acts to pinch off the cylindrical stream 15 of carrier gas into a series of small bubbles 16, the diameter of which is primarily a function of the diameter of the cylindrical stream 15 of carrier gas and the surface tension.

Figure 3:
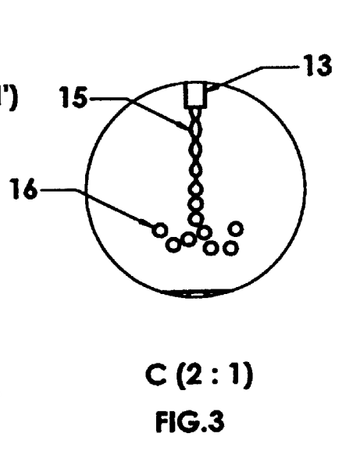
FIG. 3 is a detail view C in FIG. 2 illustrating the bubble formation process in accordance with the present invention.

Detail C of FIG. 2 shown in FIG. 3 in an enlarged view of the bubble formation process. The cylindrical stream 15 stretches down into the process chemical liquid 14 as shown in FIG. 2 for a substantial depth shown in FIG. 3 as a chain of several interconnected bubbles forming the cylindrical stream 15 extend well below the outlet end of the laminar flow generator tube 13 until bubbles 16 separate from the cylinder 15 and curve outwardly and upwardly towards the surface of the process chemical liquid 14. The bubble diameter in of both bubbles withing cylinder 15 and ascending gas bubbles 16 is almost independent of flow rate. The rate at which an ascending gas bubble 16 becomes saturated with the chemical vapor increases as the ratio of bubble surface area to volume increases. Hence smaller diameter bubbles 16 saturate more quickly than larger diameter bubbles 16. That is to say that the series of small bubbles 16 rises up through the process chemical liquid 14 and quickly becomes fully saturated with chemical vapor due to their large surface-area-to-volume ratio. Additionally, the buoyancy of a bubble 16 is proportional to the cube of the diameter of the bubble 16. While the drag on an ascending bubble 16 is proportional to the square of the diameter of the bubble 16, smaller diameter bubbles 16 ascend more slowly than larger diameter bubbles 16. Under these conditions the exiting cylindrical stream of carrier gas maintains a small diameter cylindrical shape in the process chemical liquid 14 for a substantial distance from the outlet end of the small inner diameter, laminar flow generator tube 13. As the stream stretches farther away from the outlet end of the generator tube, the surface tension at the carrier gas/process chemical liquid interface acts to pinch off the cylindrical stream of carrier gas into a series of small bubbles whose diameter is primarily a function of the diameter of the cylindrical stream of carrier gas and the surface tension. The bubble diameter is almost independent of flow rate. The series of small bubbles rises up through the process chemical liquid and quickly becomes fully saturated with chemical vapor due to their large surface-area-to-volume ratio. A further benefit of maintaining small bubble size is that the rate of bubble ascent of bubbles 16 to the surface of the process chemical liquid 14 is limited, thus increasing contact time with the process chemical liquid 14 while minimizing splashing and the formation of aerosol droplets of liquid when the bubble breaks the surface of the process chemical liquid. The carrier gas vapor outlet port 18 passes through the top of the bubbler container 30 and is located behind the plenum 10 such that the plenum 10 acts as a baffle to shield the carrier gas vapor outlet from the surface of the process chemical liquid 14 as a further means of preventing any liquid from entering the outlet stream passing through the carrier gas vapor outlet port 18.

Thus, as the bubbles 16 become smaller, the contact time of the bubbles 16 with the process chemical liquid 14 increases and the small diameter of the bubbles 16 minimizes splashing and the formation of aerosol droplets of liquid when a bubble 16 breaks the surface 17 of the process chemical liquid 14 with the surface 17 a height H far above the bottom 33 of the bubbler container 30 and the lower ends of the long, laminar flow generator tubes 13. As shown in FIG. 2, the surface 17 and the height H are well above the mid-level of the bubble container 30 reaching near the tops of the long, laminar flow generator tubes 13.

A mixture of carrier gas saturated with chemical vapor exits from the bubbler container 30 through outlet port 18 and gas outlet fitting 19, e.g. VCR™. A plenum cap 11 is attached to the top 34 of the bubbler 31 by three welded spacers 20 spaced 120° apart (only one of which is shown in FIG. 2 for convenience of illustration) to form the shielded volume 21 that supplies the gas vapor mixture to outlet port 18.

Figure 4:
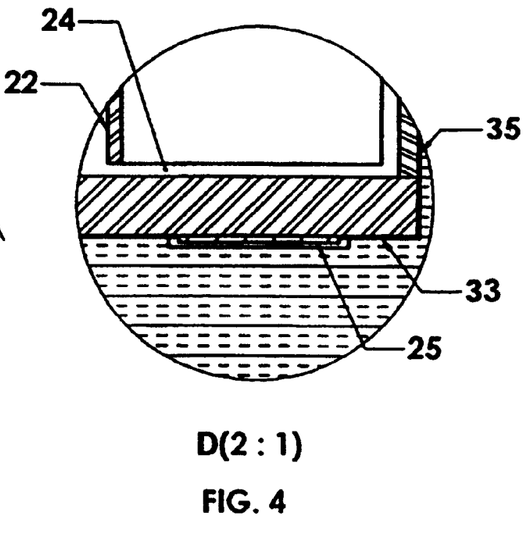
FIG. 4 is a detail view D in FIG. 2 illustrating the gap at the bottom of the baffle and the piezoelement.

The level of the process chemical liquid 14 is sensed by a sensing means, such as a transducer 25 such as an acoustical level sensor, optical or thermal level detectors. Acoustical level sensing is a preferred method because it is non invasive and it has the inherent capability of sensing a continuum of chemical liquid levels rather than a few discrete levels. Referring to FIGS. 1, 2 and 4, a baffle which is attached to the sidewall 32 of the bubbler 31, partially isolates a column 22' of the process chemical liquid 14 from the main volume of the bubbler 31 and keeps the surface 23 of this column 22' relatively smooth compared to the bubble agitated surface 17 of the main volume of the process chemical liquid 14. Small gaps 24 at the top and bottom of the baffle 22 connect the volume enclosed by the baffle 22 with the rest of the volume of the bubbler container 30, thus allowing the level H' of the process chemical liquid 14 in the column 22' enclosed by the baffle 22 to remain in equilibrium with the level H of the process chemical liquid 14 in the main volume contained in the bubbler container 30. The transducer 25 is preferably a piezoelement, e.g. APC 850 manufactured by American Piezoceramics, Inc., Mackeyville, Pa., has a diameter of 12.7 mm (0.5 inch), a thickness of 1.0 mm (0.04 inches), and an acoustical resistance of $30.5 \times 10^6$ Pa·s/m. The piezoelement transducer 25 has a radial mode resonance frequency of approximately 160 kHz and a thickness mode resonance frequency of 2 MHz is bonded to the outside surface of the bottom 33 of the bubbler 31 using a high temperature epoxy, e.g low viscosity resin and hardener from Duralco 4461 which is mixed and cured in accordance with the instructions of the manufacturer; Cotronics Corporation, Brooklyn, N.Y.

The piezoelement transducer 25 is located under the column 22' of the process chemical liquid 14 enclosed by the baffle 22. Piezoelement transducer 25 serves as both an acoustical transmitter and receiver converting electrical vibrations into mechanical vibrations and converting received mechanical vibrations into electrical vibrations. A pulse of electrical energy having a center frequency of 2 MHz is applied to the piezo-element transducer 25 generating a compressional elastic pulse that propagates through the bottom 33 of container 30 and into the process chemical liquid 14. Acoustical energy is transmitted relatively efficiently between the piezoelement transducer 25, stainless steel bottom 33 of bubbler container 30 of the bubbler 31 and the process chemical liquid 14 due to their relatively well matched acoustical impedances of $3.5 \times 10^6$, $40 \times 10^6$ and $2 \times 10^6$ Pa·s/m respectively. The compressional acoustic wave propagates vertically up through the process chemical liquid 14 and is reflected at the chemical liquid 14 surface 23 due to the large impedance mismatch at this liquid/gas interface; the acoustical impedance of a gas is typically in the range of from about 30 Pa·s/m to about 400 Pa·s/m versus $2 \times 10^6$ Pa·s/m for a liquid. The reflected acoustical pulse propagates down through the process chemical liquid 14, through the bottom 33 of the bubbler 31 and therefrom into the piezoelement transducer 25, where-upon it is converted into electrical vibrations that are detected and processed by electronic circuitry shown in FIG. 7 that is connected to the transducer 25 by a cable 26.

Referring again to FIG. 7, a digital signal processor (DSP) 60 provides pulse generating signals which are connected by bus line 64 to the data buffer 61A that is connected to digital-to-analog converter 61B which sends analog pulses to transmitter amplifier 61C that sends an ana-log pulse to multiplexer 62, which send the pulse on the cable 26 to energize the transducer 25. When the transducer 25 receives the mechanical vibrations and converts them into electrical vibrations, it generates analog output pulses connected by cable 26 to the multiplexer 62 which sends its output to analog receiver amplifier 63A that provides an output to digital-to-analog converter 63B which supplies digital output pulses to data buffer 63C which is connected to the DSP 60 for processing. The DSP 60 employs programs stored in a computer storage device, e.g. EPROM 65 (comprising a non-volatile memory). EPROM contains a liquid level control program of the kind shown in FIG. 8. Data can be entered into the DSP 60 with the numeric display and keypad 66 or the equivalent, as will be well understood by those skilled in the art. When the DSP 60 determines, by using the computer program of FIG. 8, that the level H' is too low, then a signal is sent on line 90 to the CVD tool process control computer 91 causing it to send an output on line 92 energizing the control valve 93 which supplies the process chemical liquid 14 to the bubbler container 30 until the level H' reaches the desired level.

Figure 8:
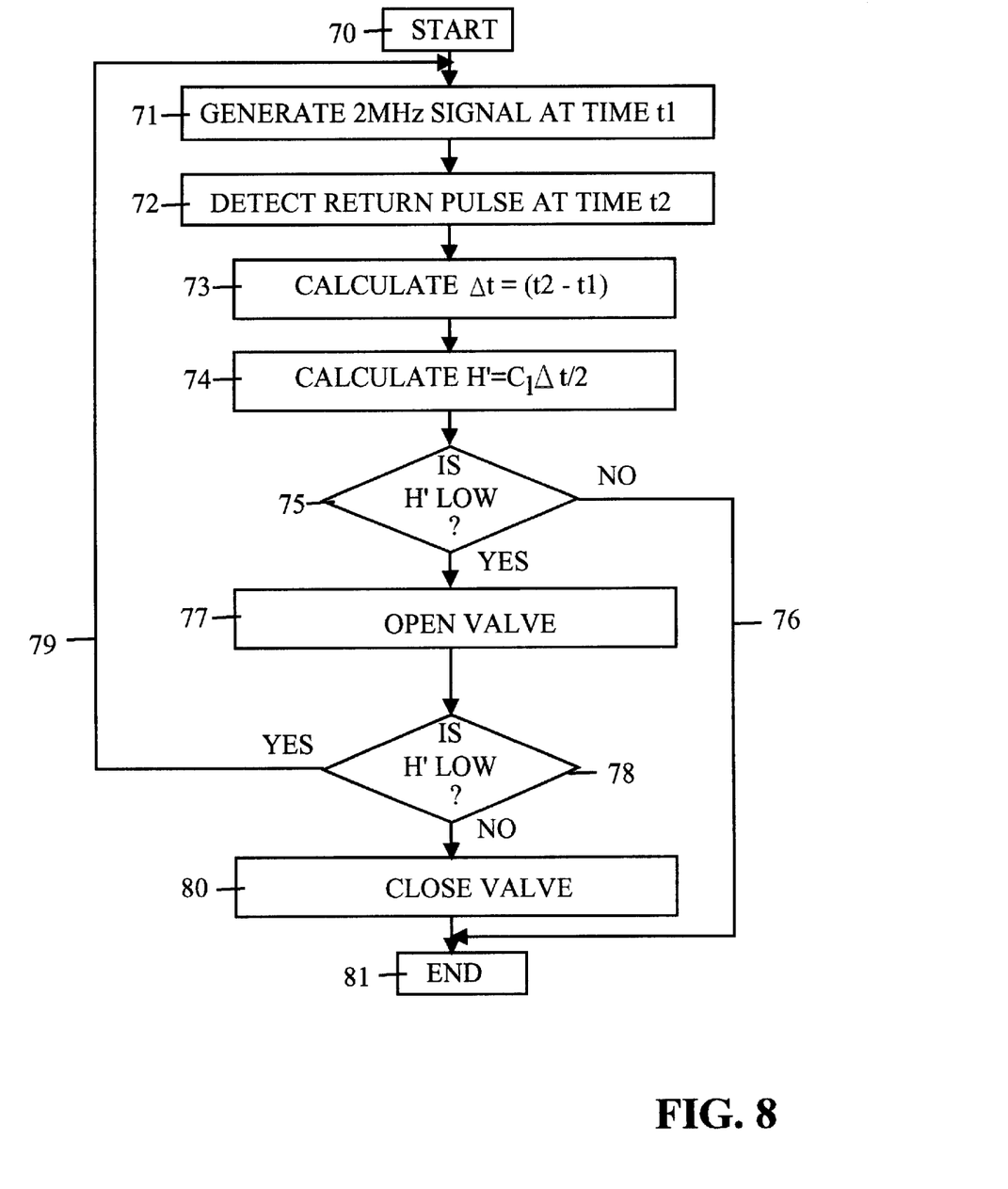
FIG. 8 is a flow chart of a program controlling the fluid level control system of this invention.

The program which performs the task of determining the level H' is shown in FIG. 8, which starts with step 70. In step 71, the program causes the DSP 60 to generate a 2 MHz signal at time t1 (with the piezo-ceramic transistor operated in its thickness mode). Then, in step 72 the program records the time t2 of detection the return pulse from transducer 25. In step 74, the value of H' is calculated. In step 75, the program tests whether the value of H' is too low. If YES, the program proceeds to step 76 in which the DSP 60 generates a signal on line 90 to cause computer 91 to open valve 93 to add some of the process chemical liquid 14 to the bubbler container 30. Then the program proceeds to step 78 which again tests whether the value of H' is too low. If the result of the test in step 78 is NO, then the program proceeds to step 80 which causes the DSP 60 to generate a signal on line 90 causing computer 91 to close the valve 93. If the result of the test in step 78 is YES, then the program proceeds on line 79 to repeat the program starting with step 71.

If step 75 issues a NO answer, then the program proceeds on line 77 to the end 78 of the routine. The program of FIG. 8 is repeated on a repetitive cycle under control of the clock in the DSP 60 to assure that the level required is maintained.

The height H' of the process chemical liquid 14 in the column 22' is computed as follows: $H' = C_l \Delta t / 2$ where:

$C_l$ is the speed of sound in the process chemical liquid 14, $\Delta t$ is the time delay between the transmitted and received pulse and the factor of ½ accounts for the fact that the acoustical pulse traversed the column 22' of the process chemical liquid 14 two times.

Because the speed of sound in most liquids is almost constant, e.g., 1300±100 meters/second a fixed speed of sound can be assumed and still maintain a liquid level measurement accuracy of ±10%. If a higher degree of accuracy is required, the true speed of sound within the actual process chemical liquid 14 can be used in the calculation. Systematic time delays can be measured during calibration and removed from the subsequent calculations. The measured level of the process chemical liquid 14 can be used for reporting alarm conditions as well as automating the filling of the bubbler container 30 with the process chemical liquid 14. Automated filling is segmented into two commonly used methods:

i) batch fill in which the level of the process chemical liquid 14 is allowed to reach some minimum value at which point a valve 93 is opened allowing the process chemical liquid 14 to flow into the bubbler container 30 until the level 23 of the process chemical liquid 14 reaches a value that is deemed to be the "bubbler full" condition and the external valve 93 is closed or;

ii) the process chemical liquid 14 is metered into the bubbler container 30 to keep the liquid level 23 at some quiescent operating level.

Referring to FIG. 5, a combination process chemical liquid 14 fill and drain tube 27 extends through the bubbler top 34 and down to a recessed area 28 machined into the inside surface of the bottom 33 of the bubbler container 30. The fill/drain tube 27 is connected to the fill/drain fitting 29, e.g. a VCR™ fill/drain fitting manufactured by Swagelok Company, 29500 Solon Road, Solon, Ohio 44139.

Lorex fabricated a bubbler 31 in accordance with the present invention, as described above, and tested its performance at flow rates up to 50 standard liters per minute using nitrogen as a carrier TM gas and isopropyl alcohol as the process chemical liquid 14. A Lorex Piezocon™ acoustical gas concentration sensor was connected to the bubbler gas outlet fitting 19 to monitor the concentration of the nitrogen gas/isopropyl-vapor stream and to detect the presence of any splashing or aerosol effects. The result was that no splashing or aerosol effects were detected to be present.

What is claimed is:

1. A method for generating a saturated mixture of a carrier gas and a chemical vapor comprising:

providing a bubbler container having a carrier gas inlet tube and a carrier gas/vapor outlet, with the bubbler container filled with a process chemical liquid, passing carrier gas from the gas inlet tube through a parallel array of a plurality of small inner diameter generator tubes into the process chemical liquid exiting therefrom with laminar flow of carrier gas comprising a corresponding parallel array of cylindrical streams of carrier gas for a substantial distance from the outlet ends of the small inner diameter generator tubes, passing output carrier gas saturated with chemical vapor from the process chemical liquid through the carrier gas/vapor outlet, and producing the output carrier gas substantially devoid of process chemical liquid droplets.

2. The method of claim 1 wherein the carrier gas inlet tube passes through the top of the bubbler container and into an enclosed plenum that distributes the carrier gas to the small inner diameter generator tubes which extend from the bottom of the plenum down into the process chemical liquid in the bubbler container.

3. The method of claim 1 wherein the dimensions of the small inner diameter generator tubes are chosen such that at the maximum carrier gas flow rate the carrier gas stream exiting each of the generator tubes into the process chemical liquid is a high velocity fully developed laminar flow and the exiting cylindrical stream of carrier gas maintains a small diameter cylindrical shape in the process chemical liquid and as the stream stretches farther away from the outlet end of each small inner diameter generator tube, the surface tension at the carrier gas/process chemical liquid interface acting to pinch off the cylindrical stream of carrier gas into a series of small bubbles.

4. Bubbler apparatus for generating a saturated mixture of a carrier gas and a chemical vapor comprising:

a bubbler container having a carrier gas inlet tube and a carrier gas/vapor outlet, with the bubbler container filled with a process chemical liquid, a parallel array of a plurality of small inner diameter generator tubes for passing carrier gas from the gas inlet tube into the process chemical liquid exiting therefrom with laminar flow of carrier gas comprising a corresponding parallel array of cylindrical streams of carrier gas for a substantial distance from the outlet ends of the generator tubes, and output means for providing the output carrier gas passing output carrier gas saturated with chemical vapor from the process chemical liquid through the carrier gas/vapor outlets substantially devoid of process chemical liquid droplets.

5. The apparatus of claim 4 wherein the carrier gas inlet tube passes through the top of the bubbler container and into an enclosed plenum that distributes the carrier gas to the generator tubes which extend from the bottom of the plenum down into the process chemical liquid in the bubbler container.

6. The apparatus of claim 4 wherein the dimensions of the generator tubes are chosen such that at the maximum carrier gas flow rate the carrier gas stream exiting each of the generator tubes into the process chemical liquid is a high velocity fully developed laminar flow causing the exiting cylindrical stream of carrier gas to maintain a small diameter cylindrical shape in the process chemical liquid and as the stream stretches farther away from the outlet end of each small inner diameter generator tube, the surface tension at the carrier gas/process chemical liquid interface acting to pinch off the cylindrical stream of carrier gas into a series of small bubbles.

7. A method for generating a saturated mixture of a carrier gas and a chemical vapor comprising;

providing a bubbler container having a carrier gas inlet tube and a carrier gas/vapor outlet, with the bubbler container filled with a process chemical liquid, passing carrier gas from the gas inlet tube through a parallel array of a plurality of small inner diameter, laminar flow generator tubes into the process chemical liquid exiting therefrom with laminar flow of carrier gas comprising a corresponding parallel array of cylindrical streams of carrier gas for a substantial distance from the outlet ends of the generator tubes, the length of each laminar flow generator tube being on the order of two orders of magnitude greater than the small inner diameter, and passing output carrier gas saturated with chemical vapor from the process chemical liquid through the carrier gas/vapor outlet, whereby the output carrier gas is substantially devoid of process chemical liquid droplets.

8. The method of claim 7 wherein the carrier gas inlet tube passes through the top of the bubbler container and into an enclosed plenum that distributes the carrier gas to the small inner diameter generator tubes which extend from the bottom of the plenum down into the process chemical liquid in the bubbler container.

9. The method of claim 7 wherein the dimensions of the generator tubes are chosen such that at the maximum carrier gas flow rate the carrier gas stream exiting each of the small inner diameter generator tubes into the process chemical liquid is a high velocity fully developed laminar flow whereby the exiting cylindrical stream of carrier gas maintains a small diameter cylindrical shape in the process chemical liquid and as the stream stretches farther away from the outlet end of each small inner diameter generator tube, the surface tension at the carrier gas/process chemical liquid interface acts to pinch off the cylindrical stream of carrier gas into a series of small bubbles.

10. The method of claim 1 wherein the cylindrical streams stretch down into the process chemical liquid for a substantial depth as a chain of several bubbles forming the cylindrical stream extending well below the outlet ends of the small inner diameter laminar flow generator tubes until bubbles in the cylindrical streams separate and curve outwardly and upwardly towards the surface of the process chemical liquid.

11. The method of claim 2 wherein the cylindrical streams stretch down into the process chemical liquid for a substantial depth as a chain of several bubbles forming the cylindrical stream extending well below the outlet ends of the small inner diameter laminar flow generator tubes until bubbles in the cylindrical streams separate and curve outwardly and upwardly towards the surface of the process chemical liquid.

12. The method of claim 7 wherein the cylindrical streams stretch down into the process chemical liquid for a substantial depth as a chain of several bubbles forming the cylindrical stream extending well below the outlet ends of the small inner diameter laminar flow generator tubes until bubbles in the cylindrical streams separate and curve outwardly and upwardly towards the surface of the process chemical liquid.

13. The method of claim 8 wherein the cylindrical streams stretch down into the process chemical liquid for a substantial depth as a chain of several bubbles forming the cylindrical stream extending well below the outlet ends of the small inner diameter laminar flow generator tubes until bubbles in the cylindrical streams separate and curve outwardly and upwardly towards the surface of the process chemical liquid.

14. The method of claim 1 wherein the bubbler container is filled to a level far above the outlet of the small inner diameter laminar flow generator tubes.

15. The method of claim 3 wherein the bubbler container is filled to a level far above the outlet ends of the small inner diameter laminar flow generator tubes.

16. The method of claim 7 wherein the bubbler container is filled to a level far above the outlet ends of the small inner diameter laminar flow generator tubes.

17. The method of claim 8 wherein the bubbler container is filled to a level far above the outlet ends of the small inner diameter laminar flow generator tubes.

18. The apparatus of claim 5 wherein the dimensions of the generator tubes are chosen such that at the maximum carrier gas flow rate the carrier gas stream exiting each of the small inner diameter generator tubes into the process chemical liquid is a high velocity fully developed laminar flow whereby the exiting cylindrical stream of carrier gas maintains a small diameter cylindrical shape in the process chemical liquid and as the stream stretches farther away from the outlet end of each small inner diameter generator tube, the surface tension at the carrier gas/process chemical liquid interface acts to pinch off the cylindrical stream of carrier gas into a series of small bubbles.

19. The apparatus of claim 18 wherein the cylindrical streams stretch down into the process chemical liquid for a substantial depth as a chain of several bubbles forming the cylindrical steam extending well below the outlet ends of the small inner diameter laminar flow generator tubes until bubbles in the cylindrical streams separate and curve outwardly and upwardly towards the surface of the process chemical liquid.

20. The apparatus of claim 19 wherein the bubbler container is filled to a level far above the outlet ends of the small inner diameter laminar flow generator tubes.

* * * * *